United States Patent
Opsal et al.

(10) Patent No.: US 7,085,676 B2
(45) Date of Patent: Aug. 1, 2006

(54) FEED FORWARD CRITICAL DIMENSION CONTROL

(75) Inventors: Jon Opsal, Livermore, CA (US); Youxian Wen, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/801,023

(22) Filed: Mar. 15, 2004

(65) Prior Publication Data

US 2004/0267490 A1 Dec. 30, 2004

Related U.S. Application Data

(60) Provisional application No. 60/483,305, filed on Jun. 27, 2003.

(51) Int. Cl.
*G06F 11/30* (2006.01)
*G01B 11/02* (2006.01)

(52) U.S. Cl. .................... 702/182; 702/81; 702/172; 356/630

(58) Field of Classification Search ............ 702/81–84, 702/85, 117, 121, 155, 156, 170, 172, 182, 702/183; 356/128, 601, 609, 612, 626, 630, 356/635; 438/5, 7, 14; 700/108–110, 121, 700/186
See application file for complete search history.

(56) References Cited

U.S. PATENT DOCUMENTS

| | | | |
|---|---|---|---|
| 5,067,805 A | 11/1991 | Corle et al. .................. 359/235 |
| 5,233,191 A | 8/1993 | Noguchi et al. ............ 250/306 |
| 5,459,404 A | 10/1995 | Josephs ....................... 324/751 |
| 5,486,701 A | 1/1996 | Norton et al. ............... 250/372 |
| 5,517,312 A | 5/1996 | Finarov ....................... 356/630 |
| 5,608,526 A * | 3/1997 | Piwonka-Corle et al. ... 356/369 |
| 5,682,242 A | 10/1997 | Eylon .......................... 356/401 |
| 5,747,813 A | 5/1998 | Norton et al. ............... 250/372 |
| 5,766,360 A | 6/1998 | Sato et al. ................... 118/666 |
| 5,859,424 A | 1/1999 | Norton et al. ............... 250/226 |
| 5,885,045 A | 3/1999 | Rush ........................... 414/416 |
| 5,889,593 A | 3/1999 | Bareket ....................... 356/445 |
| 5,940,175 A | 8/1999 | Sun ........................... 356/237.3 |

(Continued)

FOREIGN PATENT DOCUMENTS

JP 63086429 4/1988

(Continued)

OTHER PUBLICATIONS

Presentation slide show by Infineon Technologies, "Feed-Forward CD Control," *SPIE 5378-14*, Mar. 2004, 27 pages in length.

(Continued)

*Primary Examiner*—Carol S. W. Tsai
*Assistant Examiner*—Manuel L Barbee
(74) *Attorney, Agent, or Firm*—Stallman & Pollock LLP

(57) ABSTRACT

Feed forward techniques can be used to improve optical metrology measurements for microelectronic devices. Metrology tools can be used to measure parameters such as critical dimension, profile, index of refraction, and thickness, as well as various material properties. Three-dimensional feature characterizations can be performed, from which parameters can be extracted and correlations executed. Process fingerprints on a wafer can be tracked after each process step, such that correlation between profile and structure parameters can be established and deviations from specification can be detected instantaneously. A "feed forward" approach allows information relating to dimensions, profiles, and layer thicknesses to be passed on to subsequent process steps. By retaining information from previous process steps, calculations such as profile determinations can be simplified by reducing the number of variables and degrees of freedom used in the calculation.

10 Claims, 7 Drawing Sheets

U.S. PATENT DOCUMENTS

| | | | |
|---|---|---|---|
| 5,943,122 A | 8/1999 | Holmes | 356/73 |
| 5,957,749 A | 9/1999 | Finarov | 451/6 |
| 5,963,329 A | 10/1999 | Conrad et al. | 356/613 |
| 5,991,022 A | 11/1999 | Buermann et al. | 356/319 |
| 5,994,914 A | 11/1999 | Tsuruta | 324/765 |
| 6,054,710 A * | 4/2000 | Bruggeman | 250/307 |
| 6,166,801 A | 12/2000 | Dishon et al. | 355/27 |
| 6,304,190 B1 | 10/2001 | Blasing | 340/686.3 |
| 6,304,999 B1 | 10/2001 | Toprac et al. | 716/4 |
| 6,424,417 B1 | 7/2002 | Cohen et al. | 356/388 |
| 6,478,484 B1 | 11/2002 | Singh | 396/611 |
| 6,590,656 B1 | 7/2003 | Xu et al. | 356/369 |
| 6,625,497 B1 | 9/2003 | Fairbairn et al. | 700/1 |
| 6,673,637 B1 | 1/2004 | Wack et al. | 438/14 |
| 6,710,890 B1 * | 3/2004 | Krishnan et al. | 356/630 |
| 6,791,679 B1 * | 9/2004 | Engelhard et al. | 356/124 |
| 6,853,873 B1 | 2/2005 | Rollo et al. | 700/121 |
| 2002/0038196 A1 | 3/2002 | Johnson et al. | 702/179 |
| 2002/0165636 A1 | 11/2002 | Hasan | 700/121 |
| 2002/0176074 A1 | 11/2002 | Hasan | 356/237.5 |

FOREIGN PATENT DOCUMENTS

| | | |
|---|---|---|
| WO | WO 03/009063 A2 | 1/2003 |
| WO | WO 03/054475 A2 | 7/2003 |

OTHER PUBLICATIONS

Igor Jekauc et al., "Complementary Feed-Forward and Feeback Method for Improved Critical Dimension Control," *SPIE 5378-14* (2004), 8 pages in length.

* cited by examiner (a)

(b)

(c)

FEED FORWARD CRITICAL DIMENSION CONTROL

This application claims priority to U.S. Provisional Patent Application No. 60/483,305, entitled "THREE-DIMENSIONAL PARAMETER CONTROL OF PROCESS STEPS USING OPTICAL SCATTEROMETRY," to Jon Opsal et al., filed Jun. 27, 2003, which is hereby incorporated herein by reference.

TECHNICAL FIELD OF THE INVENTION

The present invention relates to dimension control in the fabrication of devices such as integrated circuits.

BACKGROUND

As the dimensions of microelectronic devices continue to shrink, and device density continues to increase, the metrology requirements for process development, monitoring, and control continue to tighten accordingly. The accuracy of parameter measurements is becoming increasingly important to optimizing both device performance and chip yield. In order to obtain an accurate and robust monitoring solution, the measurement sensitivity of metrology tools therefore must continue to improve. Measurements can be made at various points in the fabrication process in order to ensure that parameters such as dimensions, profiles, and depths are maintained within specification. In the manufacturing of modern integrated circuits (IC), for example, important parameters of the semiconductor structure can be monitored after each consecutive fabrication step to ensure high quality of the final IC product. One of these parameters is the so-called critical dimension ("CD"). The CD typically refers to the minimum line width that can be fabricated for a microelectronic device. Presently, the CD of a single line feature is too small to be measured optically.

One current conventional metrology technique to monitoring and/or controlling the CD utilizes top-down scanning electron microscopy (CD-SEM), which at best measures an apparent width of a feature or structure. The CD-SEM monitors process excursion by measuring changes in the CD parameter. Single CD-SEM measurements are not enough to control these processes, however. In order to establish a correlation between profile parameters, i.e. CD, side-wall angle, and side-wall shape, as well as other parameters of the semiconductor film stack, such as may include thickness, dispersion of the patterned layers, and/or underlying layers, a combination of several different techniques performing a variety of measurements is required. One existing combination includes a CD-SEM system and an optical thin film metrology system. Measurements using this combination are very time-consuming, and require different test structures and destructive cross-sectional analyses of the wafers.

Another existing metrology approach used for microelectronic devices such as integrated circuits includes a spectroscopic, diffraction-based approach. Such an approach can be preferred over techniques such atomic force microscopy (AFM) because the approach is rapid and non-destructive, and can be preferred over techniques such as CD-SEM due to the relatively inexpensive cost. In a diffraction-based approach, a model of the feature to be measured is constructed, based on a number of variable parameters. This model then can be compared with the actual, measured diffraction data. The parameters of the model can be adjusted until the correlation between the model and the data reaches an acceptable amount. When creating and using a model for such a profile, a regression algorithm capable of determining the profile using spectral intensity data can be used such as described, for example, in U.S. Pat. No. 5,963,329, hereby incorporated herein by reference. A downside to such an approach is the potential complexity of such adjustments. For instance, to measure a line width it is first necessary to define each edge location of the line, through use of a model developed for edge detection. In many situations the number of variables needed for such a model, which often needs to include variables for underlying layers as well, is large enough to effectively prohibit the creation and use of such a model, let alone the creation and use of a library of such models necessary for the various feature types. Further, changes and drift in the fabrication process can introduce significant measurement error, even to the point where the model is invalid for the device being measured. The above-mentioned techniques also are generally unable to accurately characterize submicron structures buried under a planarized, overlying material layer.

DETAILED DESCRIPTION

Systems and methods in accordance with embodiments of the present invention can overcome these and other deficiencies in existing metrology systems. Tools used in such metrology systems can include, for example, optical reflectometry devices used for measuring critical dimension, profile, and/or thickness, as well as for determining material properties of each film in a multi-layer stack on a microelectronic device. Optical metrology techniques can be used to perform three-dimensional characterizations of semiconductor features, extract parameters from the characterizations, and execute various correlations using a single test pad. In one embodiment, an optical metrology approach, such as a reflectometry/scatterometry approach, not only monitors the process excursion through three-dimensional information, but also keeps track of the process fingerprints left on the wafer after each process step. As a result, any deviation from specification following a particular process step can be detected instantaneously before the next process step begins. Correlation between profile and feature parameters also can be established immediately following each of the process steps.

Figure 1:
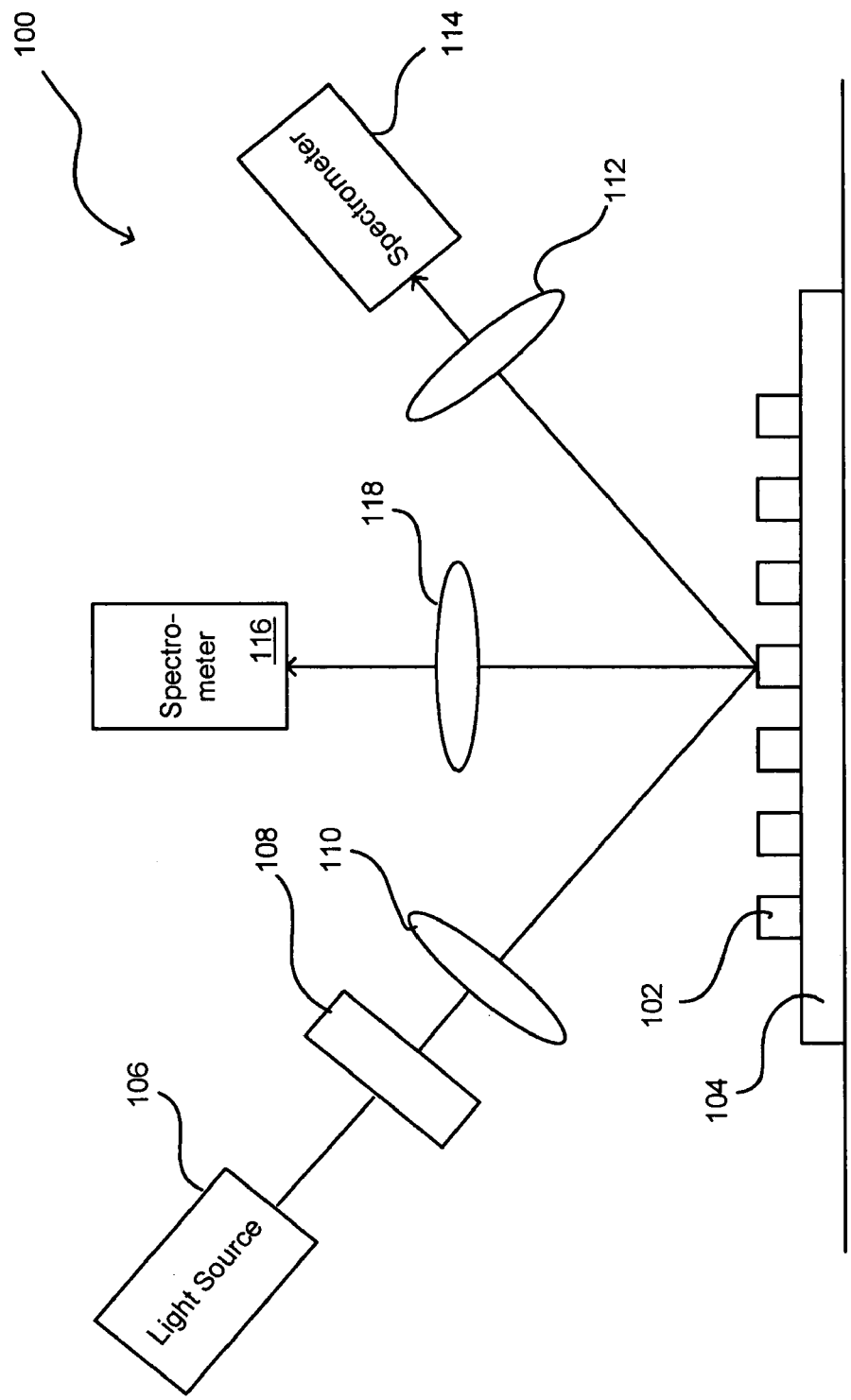
FIG. 1 is a diagram of a metrology system that can be used in accordance with various embodiments of the present invention.

FIG. 1 is a diagram of a basic spectrometer system 100 that can be used for metrology in accordance with various embodiments of the present invention. A feature 102, such as a single line or grating structure on a semiconductor 104, is positioned in the metrology device. A light source 106, which can be any appropriate light or radiation source such as a broadband or polychromatic light source, can illuminate a spot on the structure. At least one optical element 108, such as a focusing lens, focusing mirror, or narrowing aperture, can be placed in the path of the light beam in order to focus the light beam to a spot on the structure. A polarizing element 110, such as a rotating polarizer, can be placed in the beam path between the focusing element and the structure in order to polarize the beam.

The light beam will reflect from the structure 102 and be directed toward a spectrometer 114. An analyzer element 112, such as a rotating analyzer, can be placed along the beam path between the structure and the spectrometer. The use of the analyzer and spectrometer allows for a detection and analysis of various spectral components of the reflected beam. The reflected beam intensities can be used in determining various parameter values for the structure, such as critical dimension, profile, index of refraction, extinction coefficient, and thickness values. In another embodiment, a spectrometer 116 can be positioned along a direction substantially orthogonal to the plane of the device 104. In this case, the light reflected from the structure can be collected by lens 118 and directed to the spectrometer.

As noted above, the shapes of line profiles encountered on semiconductor wafers during fabrication can take on a variety of shapes. Such profiles can be situated below layers of materials different from the profile material. When optical metrology techniques such as those described with respect to FIG. 1 are used to measure such profiles, the radiation can interact with the one or more layers of the device, and radiation reflected from any or all of the layers can be detected. In existing measurement approaches, the contribution of the measured signal due to the presence of multiple layers can be difficult to separate from the contribution due to the profile. By retaining information obtained previously for the underlying features and/or structures, in accordance with the present invention, the effects of the underlying features can accounted for when determining the profile and parameters from the measured signal. Existing techniques do not have such capability.

For example, an optical metrology system such as that shown in FIG. 1 can be used to measure the progress of microelectronic fabrication at various stages in the process. One approach that can be used in accordance with embodiments of the present invention is illustrated schematically in the process of FIGS. 2, 3, and 4. As can be seen with respect to the Figures, process variations introduced at each process step can be identified by comparing changes in the process fingerprints of the structure profile, as well as the thicknesses of the underlying film layers throughout the process flow.

Figure 2:
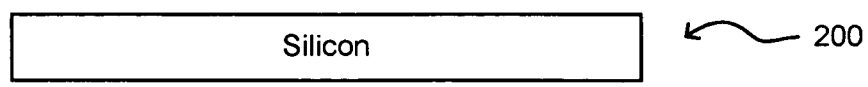
FIG. 2 is a diagram of process steps and measurements that can be made using the system of FIG. 1.
Figure 2:
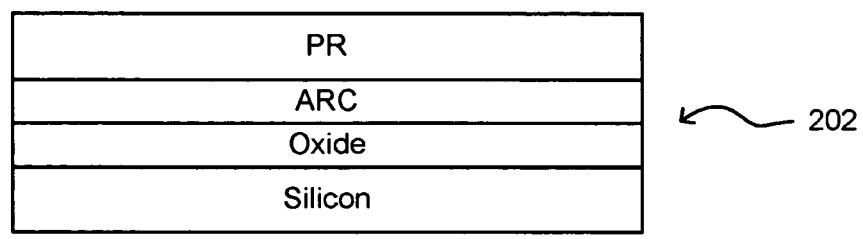
Figure 2:
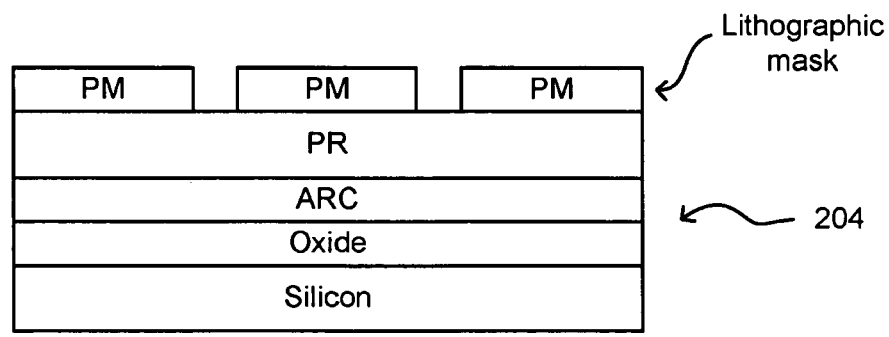

FIG. 2 shows some of the initial steps in an exemplary lithography process, whereby a line pattern for a microelectronic device can be transferred to a layer stack on a silicon wafer by selectively exposing a layer of photosensitive material deposited on the stack. In a first step 200, a top surface of a silicon wafer is prepared for use as a substrate for an array of microelectronic devices. In a second step 202, a number of material layers can be deposited on the prepared silicon surface. For example, a layer of oxide can be formed on the prepared silicon surface. Optical reflectometry data can be taken after the formation of the oxide layer, in order to obtain an accurate measurement of the characteristics of the oxide layer. Such characteristics can include, for example, layer thickness, index of refraction, and extinction coefficient. The parameters thickness of the oxide layer can be retained for future comparison and/or correlation. After the oxide layer is formed, a layer of anti-reflective coating (ARC) can be deposited on the oxide layer, and a layer of photoresist (PR) can be deposited onto the ARC layer. The layers can be deposited using any of a number of well known deposition techniques, such as sputtering, chemical vapor deposition (CVD), epitaxy, and evaporation techniques. The layer of photoresist also can be spun-on the top layer using any of a number of such techniques as known in the art. After the deposition of any or all of these layers, optical reflectometry data can be collected in order to obtain measurements of parameters such as the thickness of each layer. The measurement of the thickness of layers such as the ARC and PR layers can be simplified, as the thickness of underlying layers such as the oxide layer has already been accurately measured and can be accounted for in the measurements of the subsequent layers. Measurements also can be taken of the silicon substrate before layer deposition if desired. At step 204, a printed mask (PM) can be positioned over the layer of photoresist. The printed mask can be located adjacent to, or separated a distance from, the photoresist layer. The printed mask has printed thereon a line pattern to be transferred to the photoresist layer. The pattern will contain areas that are either transparent or opaque to the source of radiation used to expose the photoresist, such that only the areas of the photoresist under the transparent areas will be exposed.

Figure 3:
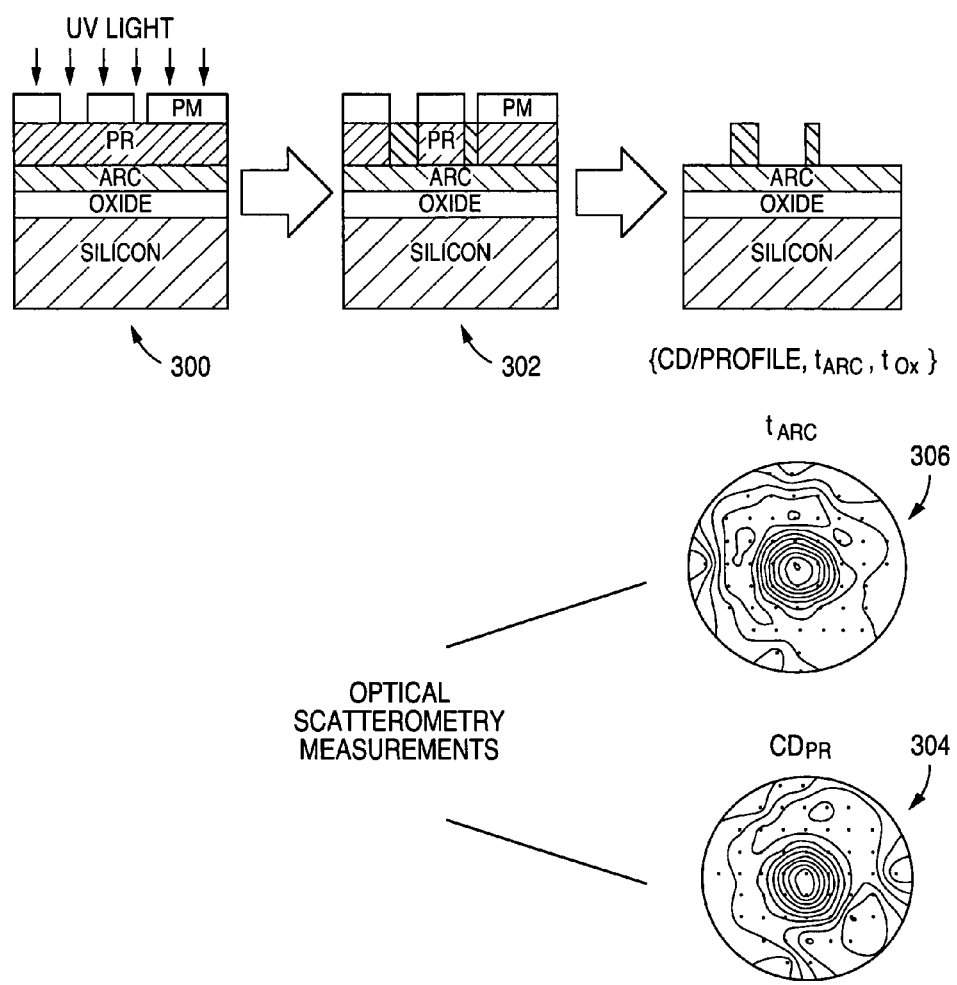
FIG. 3 is a diagram of additional process steps and measurements that can be made using the system of FIG. 1.

As can be seen from FIG. 3, radiation such as UV light can be directed at a normal angle through the printed mask onto the photoresist layer in step 300 in order to expose the photoresist. The photoresist, or layer of photosensitive material, will experience a change in physical properties, such as the chemical resistance, of the areas selectively exposed to radiation of a specific wavelength. After the selective exposure of the photoresist, the next step 302 involves removing portions of the layer of photoresist. A developer solution can be applied to the photoresist layer after exposure, such that either the exposed or unexposed areas will be etched away, depending on the changes in chemical resistance discussed above. Optical metrology data, such as reflectometry/scatterometry data, can be taken after the exposure to UV light in step 300 and/or the removal of the photoresist (PR) layer in step 302. Three-dimensional maps of the CD of the remaining areas of PR coating ($CD_{PR}$) 304, as well as the thickness of the anti-reflection coating ($t_{ARC}$) 306, can be obtained using optical reflectometry measurements as is known in the art. These values can be analyzed and retained for future comparison and/or correlation. Further, the measurement of these values can be simplified by the fact that the thickness of the oxide layer is already known and has been retained, such that the oxide thickness can be accurately accounted for in the three-dimensional maps. The next technological step 400 in the process, shown in FIG. 4, involves an etching of the hard mask (HM) layer, which effectively transfers the pattern of the photoresist layer to the oxide layer using one of a number of etch processes as known in the art. The CD of the hard mask ($CD_{HM}$) 402 can be measured, analyzed, and retained. After the hard mask dimensions are measured, the underlying silicon can be etched 404. Subsequent to the etching of the silicon, several important characteristics of the structure can be obtained through metrology measurements. These characteristics can include, for example, the critical dimension of the silicon ($CD_{Si}$) 406, the thickness of the oxide layer ($t_{Ox}$) 408, and the thickness of remaining Si layer ($t_{Si}$) 410, as well as characteristics such as the index of refraction and extinction coefficient.

Utilization of such a non-destructive optical metrology technique enables monitoring and control of the process at each step in the process flow. Implementation of such a technique also can significantly improve the yield of such processes, and can reduce the cost associated with process monitoring. Such approaches to optical metrology can also find similar benefit in other processes, such as various lithography, etch, chemical-mechanical planarization, and thin film technological manufacturing processes.

The benefits of feed forward utilization of parameter measurements can be obtained in processes utilizing multiple processes and/or tools. In one exemplary implementation of a feed forward approach, information relating to parameters such as dimensions, profiles, and layer thicknesses can be obtained during a process step at a single site on a wafer, such as a test pad. This information then can be "fed forward" to the next process step at that site, whether or not the next process occurs in the same tool or station. In many systems, measurements are made after process steps for quality control purposes, such that adjustments can be made to the tool for the process step if the process starts to vary from a near-optimal process result. Systems and methods in accordance with embodiments of the present invention can utilize this information for subsequent process steps, instead of jettisoning the information after the processing of the next wafer or storing the information in the tool itself.

If a subsequent process step uses the same tool, for example, the tool can simply retain the measurement values in memory to be used in measurement calculations for the next process. For example, if in the process of FIG. 4 the hard mask and silicon etch steps are executed in the same process tool, the tool can retain the measurements of the critical dimension of the hard mask to be used as a starting point, or trial value, when measuring a profile of the silicon features etched using the hard mask. Also, the subsequent measurement then already knows the profile of the hard mask such that those variables can be fixed, thereby simplifying the calculation. If the subsequent process is in another tool or device, the measurement data can be transferred with the device or wafer through, for example, a fabrication automation system. The wafer and associated measurement data can be correlated, for example, through use of conventional wafer ID number. Since prior measurement data is passed to subsequent process tools, the tools can use that data during metrology measurements to fix at least some of the parameters, such as the thickness and profile of layers or features from previous processes, such that the metrology calculation can be simplified without a significant loss in accuracy. In cases where a prior measurement might change due to a subsequent process, the previous measurement can be discarded and re-measured, or can be used as a starting parameter value in a model that can compensate for an expected variation in measurement value.

Figure 4:
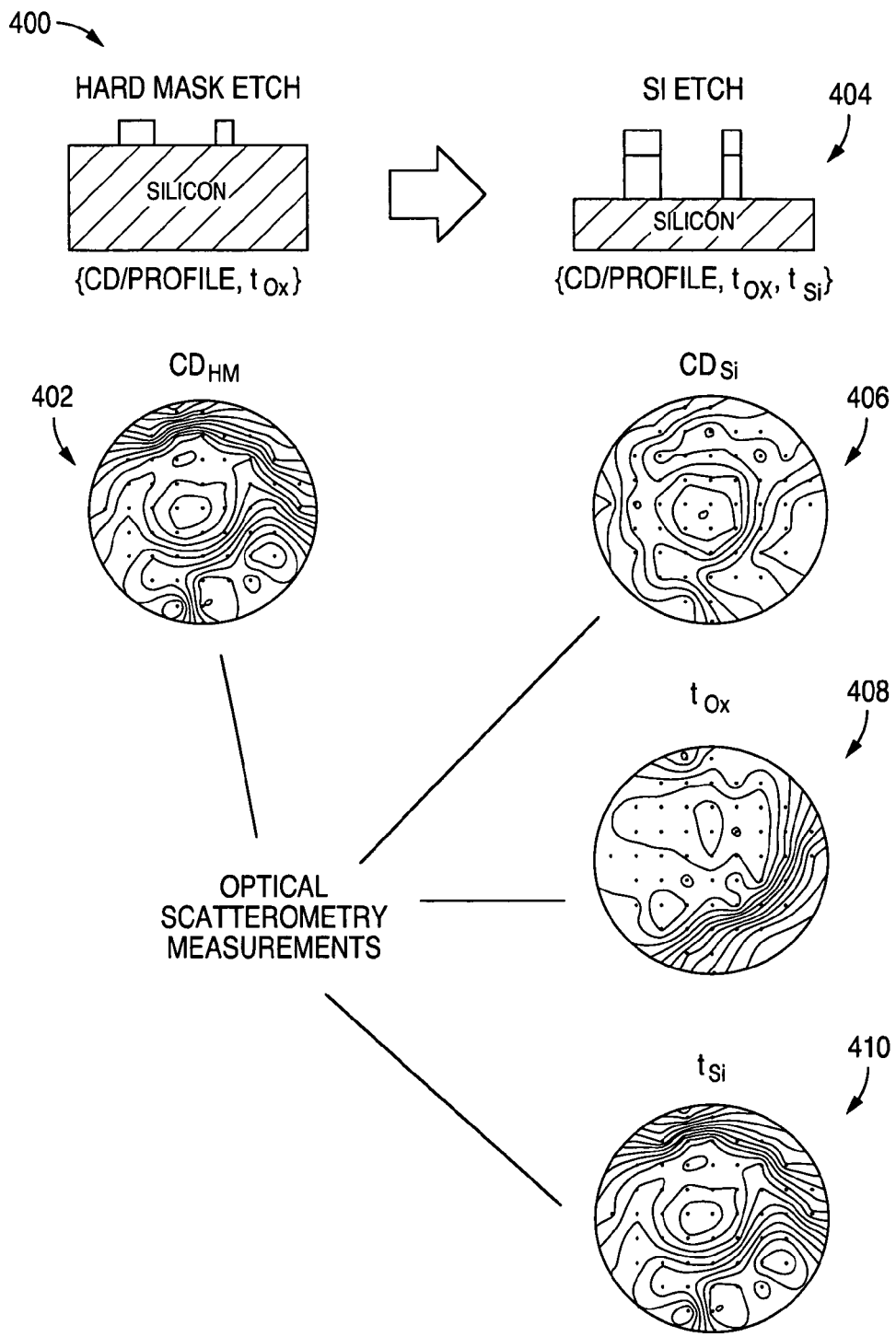
FIG. 4 is a diagram of additional process steps and measurements that can be made using the system of FIG. 1.

An exemplary feed forward approach can be described using the conventional photolithography process of FIGS. 2–4. When micromachining using lithographic processes, a photosensitive material can be deposited onto a layer or material, or a stack of layers, to be etched, such that a pattern can be transferred to at least one of said layers. Thickness measurements of the layer or layer stack can be made both before and after deposition of the resist material. These measurements can be stored in the deposition process tool or passed to the next tool, depending on process flow. The layer of resist can be exposed to a source of radiation that functions to change the chemical resistance of a desired area or areas of the resist layer, such that when a developer solution is applied to the resist layer either the exposed or unexposed area(s) will be etched away. This process can be used to transfer a pattern unto the photoresist layer, such as a pattern for an IC device. A measurement of the critical dimension and thickness of the etched photoresist and underlying layer(s) can be made. Since information about the underlying layers was retained, it is possible to have a better idea of the characterization of the photoresist etch. Retaining the prior information also allows for a determination of whether underlying layers were affected by the etch process. Such determinations not only allow for better control of the etch process, but can provide valuable information for subsequent measurements.

The etched photoresist layer can act as a temporary mask for an underlying layer, in order to create small dimension features in the underlying layer. An etch process can be used to etch the exposed portions of the underlying layer. After the etch, the photoresist can be stripped from the sample. Measurements can be made after either or both of these process steps, but typically will be made after the stripping of the photoresist in order to obtain measurements of the critical dimension and layer thickness of the underlying (now top) layer.

Figure 5:
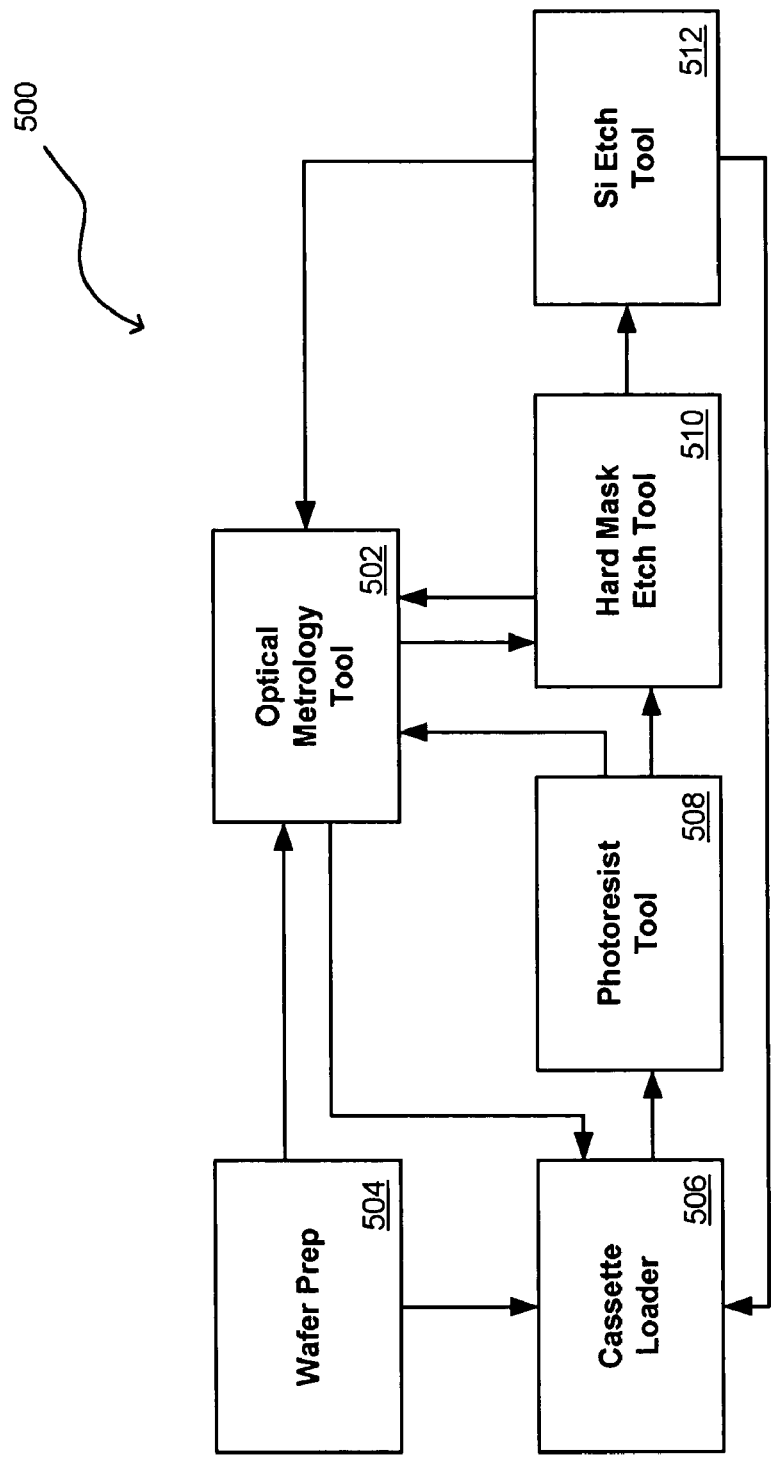
FIG. 5 is a schematic diagram of a processing tool arrangement that can be used with the processes of FIGS. 2–4.

FIG. 5 is a schematic diagram of a processing tool arrangement 500 that can be used with a process such as described with respect to FIGS. 2–4. The diagram illustrates points in the process at which measurements such as critical dimension and thickness measurements can be made. Surface lithography can be performed in a single tool, a number of tools, or in a module of an IC fabrication process flow, which can include surface preparation and alignment steps in addition to the deposition, exposure, and development steps. Although a single metrology tool 502 is shown in the diagram, it should be understood that multiple optical measurement modules can be used either as part of a single tool or as a separate tools between process steps. A wafer prep station 504 is shown, which can include a number of tools for fabricating the silicon wafer and depositing additional layers, such as oxide and anti-reflective layers, as well as any other tools necessary for processes such as surface preparation and baking. After the wafer is prepared, or after any step in the preparation process if desired, the wafer can be transported to an optical metrology tool 502 such as a spectrometer described with respect to FIG. 1. The metrology tool can be used to obtain an initial measurement of the thickness of the layers on the wafer, which can be retained for subsequent measurements. Typically, the wafer is transported to a wafer cassette after the wafer is prepped using a loading station 506, such that the wafer can be safely stored before subsequent processing. When the wafer is to be processed, the wafer can be transported to a photoresist station 508, which can apply a layer of photoresist to the surface of the wafer. The same tool, or a different tool of the photoresist station 508, can expose and develop the photoresist in order to transfer the pattern to the photoresist layer as a resist mask. One the resist mask is prepared, the wafer can be transferred to the next tool in the process, or to a metrology tool 502, in order to obtain measurements such as the critical dimension of the photoresist and the thickness of the anti-reflection coating, or masking layer. The wafer then can be transferred to an etch chamber 510 for etching the oxide layer. Once the pattern of the resist mask is etched into the oxide layer to create a hard mask, and typically after the residual resist mask has been removed, the wafer can be transferred to the next process tool or transferred to the metrology tool 502. In the metrology tool, measurements can be made which can be used to determine, for example, the critical dimension of the hard mask and the thickness of the etched oxide layer. Since information about the thickness of the original oxide layer was obtained previously, the measurement of the critical dimension and determination of process effects on the thickness of the resultant hard mask can be much more accurate and quick to obtain than otherwise would be possible. The wafer then can be transferred to another etch station 512, or the same etch station in some embodiments, in order to etch the silicon. Once the pattern is etched into the silicon, the wafer can be transferred to the spectrometer in order to determine the critical dimension of the silicon, the thickness of the silicon, and the thickness of the residual oxide layer. The wafer then can be transferred back to the cassette loader station 506 for storage in a wafer cassette or pod.

Figure 6:
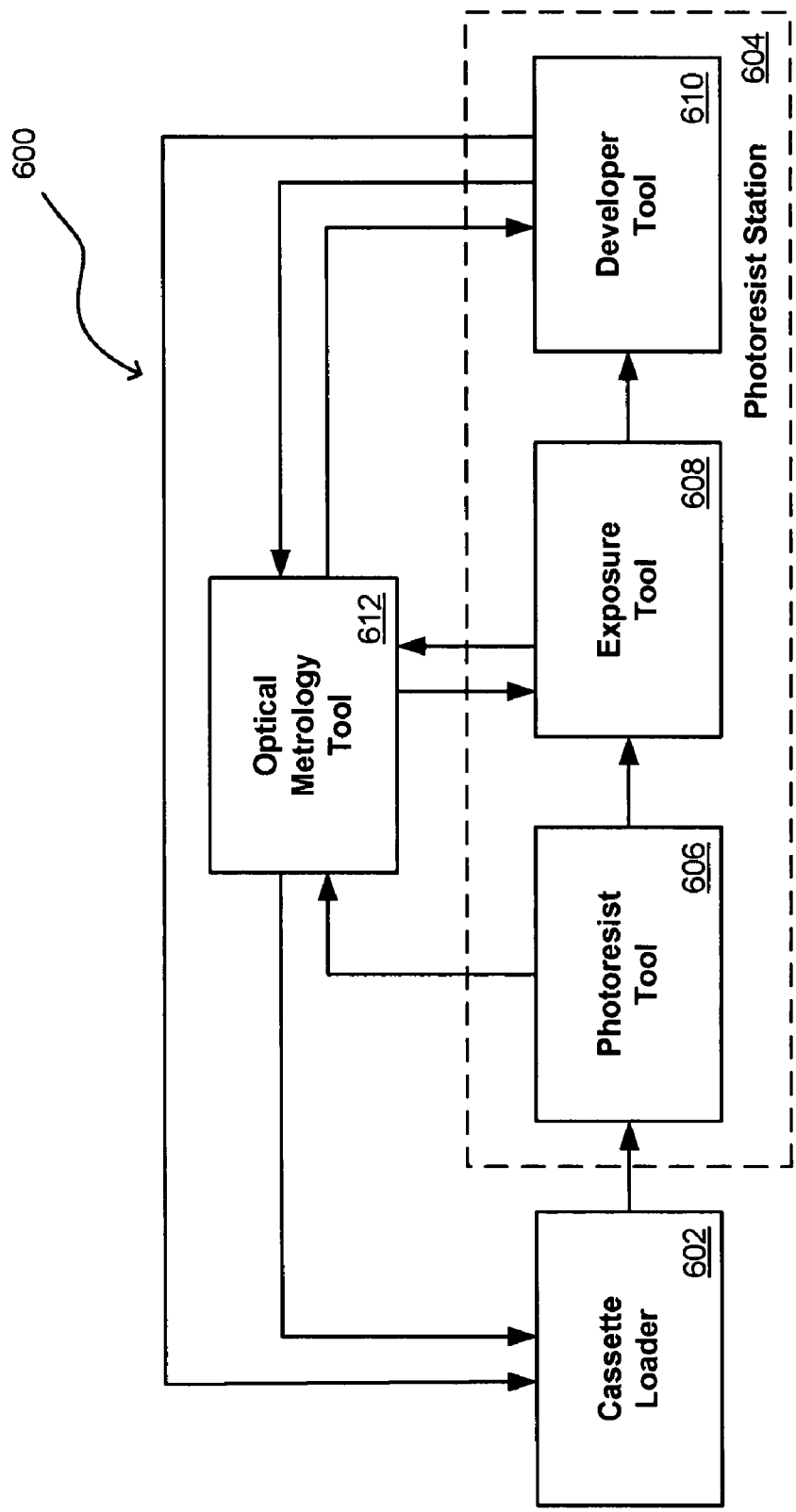
FIG. 6 is a schematic diagram of a processing tool sub-arrangement that can be used with the arrangement of FIG. 5.

Intensity measurements can be made after any process step, for at least some of the wafers in the process. In some embodiments it can be desirable for a majority of the wafers to undergo a subset of the possible measurements, while a small number of wafers are examined periodically after any or all process steps in order to ensure that all process steps are operating within specification. For example, in the tool sub-arrangement of FIG. 6 it can be seen that a wafer loaded into the photoresist station 604 from a cassette loader 602 can pass through a number of tools of the station, such as a photoresist deposition tool 606, an exposure tool 608, and a developer tool 610. After any or all of these tools, the wafer can be measured to monitor, for example, the thickness of the photoresist layer after deposition, exposure, and/or development. Information about the thickness of the deposited photoresist layer might be fed forward when looking at the exposure and/or developed thickness, but only information about the developed thickness might be fed forward to other process tools. In order to save memory space and bandwidth, it can be desirable to feed forward only those variables that will be useful for subsequent measurements. For example, if the thickness of the photoresist layer changes between the deposition and development steps, the measured thickness after the development step will give a better determination of thickness for subsequent measurements and therefore can be the only variable fed forward from the photoresist station.

Model Fitting

When utilizing optical metrology approaches for high-speed, non-destructive measurement of features or microstructures being patterned onto semiconductor wafers, a small spot on a measurement sample typically is illuminated with optical radiation comprising one or more wavelengths. The properties of the sample, including those described above, can be determined by measuring characteristics of radiation reflected or diffracted by the sample (e.g., reflection intensity, polarization state, or angular distribution). In order to obtain accurate measurements of parameters such as line widths, which for some systems can be too narrow to measure directly and do not reflect enough light to give accurate measurements relative to the background, the measurements can be made of an area containing a diffractive structure formed on or in a substrate, which can be comprised of a plurality of such lines. For systems in which a single line of the critical dimension cannot accurately be measured, the fabrication of multiple parallel lines of the critical dimension in width can provide sufficient reflection and diffraction to yield accurate parameter measurements using optical metrology. When examining such a structure, lateral material inhomogeneities in the structure can give rise to optical diffraction effects. If the lateral inhomogeneities are periodic with a period significantly smaller than the illuminating wavelengths, then diffracted orders other than the zeroth order can be evanescent and not directly observable, or can be scattered outside the field of view of the detection instrument. Lateral structure geometry can nevertheless significantly affect the zeroth-order reflectivity, allowing measurement of structural features much smaller than the illuminating wavelengths.

A variety of measurement methods applicable to features on semiconductors and microdevices are known in the art. A straightforward approach is to use a rigorous, theoretical model based on Maxwell's equations to calculate a predicted optical signal characteristic of the feature or sample (e.g. reflectivity) as a function of sample measurement parameters (e.g., film thickness, linewidth, etc.), and adjust the measurement parameters in the model to minimize the discrepancy between the theoretical and measured optical signal. One such approach to characterizing structures on a sample is disclosed in International Patent Application No. PCT/US02/18994 (International Publication No. WO 03/009063) entitled "REAL TIME ANALYSIS OF PERIODIC STRUCTURES ON SEMICONDUCTORS," to Jon Opsal et al., which is hereby incorporated herein by reference. In an exemplary measurement process, a set of trial values of the measurement parameters is selected. The set that is selected can depend upon a number of factors, such as the process and materials being used. Based on these trial values a computer-representable model of the measurement sample structure can be constructed. The electromagnetic interaction between the sample structure and illuminating radiation can be numerically simulated to calculate a predicted optical signal characteristic, which can be compared to the measured signal characteristic. An automated fitting optimization algorithm can iteratively adjust the trial parameter values, and the fitting process can be repeated until the discrepancy between the measured and predicted signal characteristic are acceptably minimized. In one example, the optimization algorithm minimizes the mean-square error of the signal characteristic components.

In one example in accordance with embodiments of the present invention, the intensity of radiation reflected or diffracted from a feature being examined can be measured as a function of wavelength. A model of the structure can be generated as described above, or as described in more detail in International Patent Application Number PCT/US02/18994, incorporated by reference above. The model can be selected from a library of models for basic structure shapes. Instead of a full set of trial values of the measurement parameters being selected as described above, many of the parameters can have fixed values taken from measurements fed forward from previous process steps. For example, if such a model is used to calculate the critical dimension of features in a photoresist mask such as shown and described with respect to FIG. 3, and shown at 304, the thicknesses of the underlying anti-reflective coating and oxide layers that were retained from measurements described with respect to step 202 in FIG. 2 can allow these parameters to be fixed such that the number of variable parameters in the photoresist feature model can be reduced by (at least) two. Reducing the number of variable parameters in the model can significantly simplify the fitting calculations. The model then can be modified through an iterative process using an automated fitting optimization algorithm as described above, until the discrepancy between the measured and predicted signal characteristic are acceptably minimized. Knowing the profile of the feature before the most recent processing step, and being able to reduce the number of variable parameters in the model, can significantly decrease the complexity and number of iterations necessary to arrive at an acceptable profile match. Similar methods can be used to obtain other profiles, such as composition, doping, and optical coating profiles.

Figure 7:
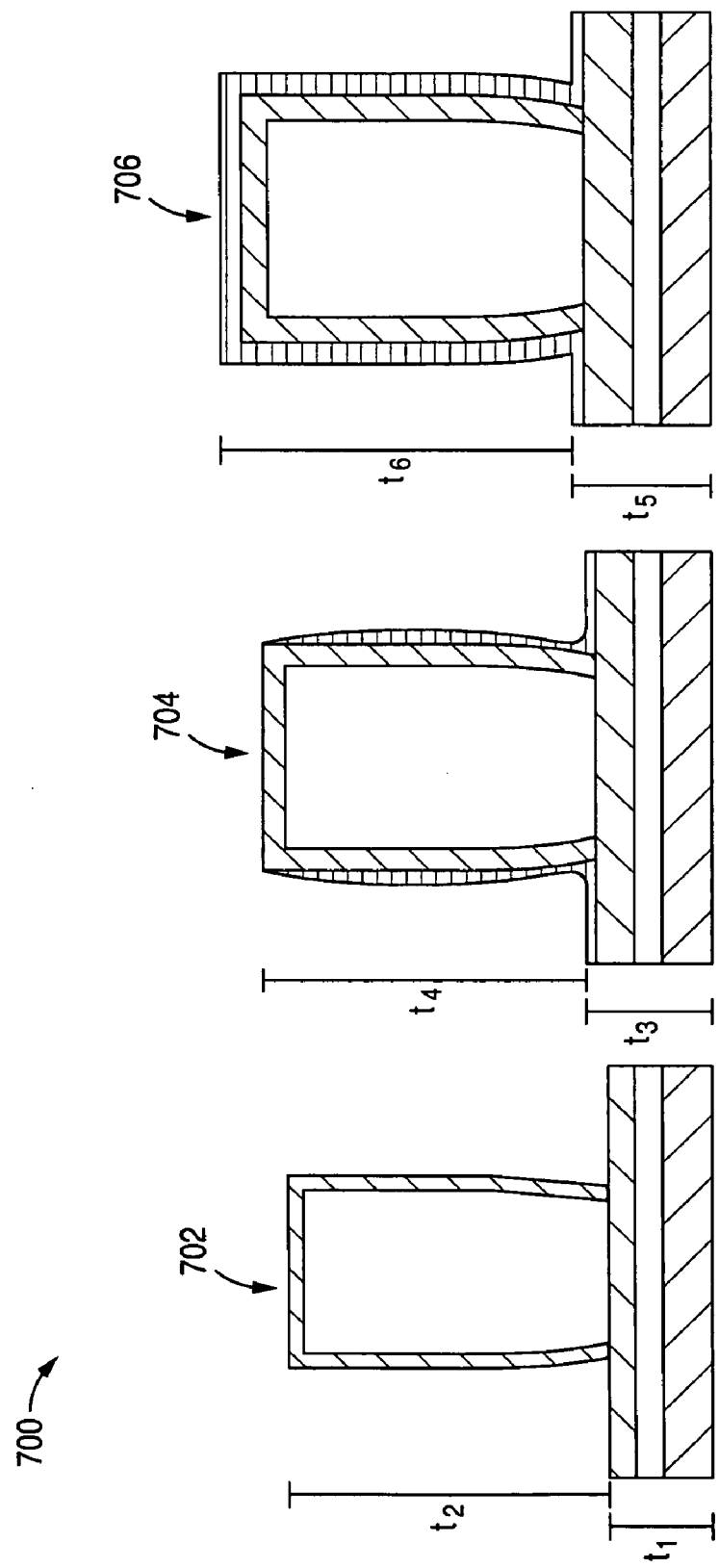
FIG. 7 is a diagram showing a feature of a microelectronic device after three steps in a fabrication process.

In another example, FIG. 7 shows the maturation 700 of a feature after subsequent steps in a fabrication process. After a first step, feature 702 has an underlying layer (stack) thickness $t_1$ and an overall feature thickness $t_2$, each of which can be determined using intensity information from an optical metrology process as described above. After a second process step, feature 704 has material deposited on the sidewalls and the underlying layers. A measurement of feature 704 would yield layer thickness $t_3$ and feature thickness $t_4$. As can be seen, $t_3$ is greater than $t_1$ as the overall layer thickness has increased, and $t_4$ is less than $t_4$ as the overall thickness of the feature has decreased. By retaining the thickness information from feature 702, it can easily be determined that the apparent decrease in feature size is due to the increase in layer thickness, and not an erosion of feature thickness. Being able to use the feature thickness and layer thickness from feature 702 also can allow a number of variable parameters to be fixed when modeling the profile of feature 704 in order to determine $t_3$ and $t_4$, thereby reducing the number of degrees of freedom in the model. Similarly, by retaining information from feature 704 it can be easier to determine the effects of the final process on feature 706, such as the thickness of the layer deposited on the top of the feature actually adding more than might be apparent due to the increase in deposition thickness on the underlying layers ($t_5$ being greater than $t_3$).

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents.

What is claimed is:

1. A method of measuring feature parameters on a wafer in a microelectronic fabrication process, comprising the steps of:
taking a first optical metrology measurement at a feature location on a wafer after a first step in a fabrication process;
determining first parameters for the feature location from the first optical metrology measurement, said determining step including comparing the measurement to theoretical optical results calculated from a first theoretical model of the wafer using a first set of theoretical parameters;
taking a second optical metrology measurement at the same feature location after a subsequent step in the fabrication process; and
determining second parameters for the feature location from the second optical metrology measurement, said determining step including comparing the measurement to theoretical optical results calculated from a second theoretical model of the wafer using a second set of theoretical parameters in combination with at least one of the previously determined first parameters used as a fixed parameter thereby reducing the number of fitting parameters needed to determine the second parameters.

2. A method according to claim 1, wherein:
determining first parameters includes determining at least one of a critical dimension, profile, refractive index, extinction coefficient, and layer thickness at the feature location.

3. A method according to claim 1, further comprising:
passing said first parameters to a process tool for modifying the subsequent step in the fabrication process.

4. A method according to claim 1, wherein:
determining the second parameters includes performing a three-dimensional characterization of the features being examined.

5. A method according to claim 1, further comprising:
illuminating a spot on the feature with a broadband light source.

6. A method according to claim 5, further comprising:
focusing light from the broadband light source to the spot on the microelectronic feature using at least one optical element selected from the group consisting of focusing lenses, focusing mirrors, and narrowing apertures.

7. A method according to claim 5, further comprising:
polarizing the light from the broadband light source using a polarizing element positioned between the broadband light source and the microelectronic feature.

8. A method according to claim 5, wherein:
illuminating a spot on the feature with a broadband light source includes light of multiple wavelengths.

9. A method according to claim 1, wherein:
taking a first optical metrology measurement includes using a spectrometer to measure characteristics of light returned from the feature location.

10. A method according to claim 9, wherein:
the characteristics being measured are selected from the group consisting of reflection intensity, polarization state, and angular distribution.

* * * * *